US011023164B2

(12) United States Patent
Jean

(10) Patent No.: US 11,023,164 B2
(45) Date of Patent: Jun. 1, 2021

(54) MANAGED NAND DATA TAGGING

(71) Applicant: Micron Technology, Inc., Boise, ID (US)

(72) Inventor: Sebastien Andre Jean, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 16/012,736

(22) Filed: Jun. 19, 2018

(65) Prior Publication Data

US 2018/0364939 A1 Dec. 20, 2018

Related U.S. Application Data

(60) Provisional application No. 62/521,939, filed on Jun. 19, 2017.

(51) Int. Cl.
 *G06F 3/06* (2006.01)
 *G11C 16/10* (2006.01)
 *G11C 16/04* (2006.01)

(52) U.S. Cl.
 CPC ............ *G06F 3/0659* (2013.01); *G06F 3/064* (2013.01); *G06F 3/0604* (2013.01); *G06F 3/068* (2013.01); *G06F 3/0608* (2013.01); *G06F 3/0611* (2013.01); *G06F 3/0647* (2013.01); *G06F 3/0649* (2013.01); *G06F 3/0661* (2013.01); *G06F 3/0679* (2013.01); *G11C 16/0483* (2013.01); *G11C 16/10* (2013.01)

(58) Field of Classification Search
 None
 See application file for complete search history.

(56) References Cited

U.S. PATENT DOCUMENTS

| | | | | |
|---|---|---|---|---|
| 8,280,853 | B1* | 10/2012 | Lai | ......................... G06F 16/113 707/651 |
| 8,386,733 | B1* | 2/2013 | Tsaur | ................... G06F 11/1458 711/163 |
| 9,052,830 | B1* | 6/2015 | Marshak | ................. G06F 3/064 |
| 9,223,843 | B1 | 12/2015 | Madhavarapu et al. | |
| 9,355,112 | B1 | 5/2016 | Armangau et al. | |
| 9,477,407 | B1* | 10/2016 | Marshak | ................. G06F 3/061 |
| 10,824,371 | B2 | 11/2020 | Jean | |
| 2004/0068627 | A1 | 4/2004 | Sechrest et al. | |
| 2011/0302577 | A1 | 12/2011 | Reuther et al. | |
| 2013/0031304 | A1 | 1/2013 | Snyder et al. | |

(Continued)

OTHER PUBLICATIONS

U.S. Appl. No. 16/012,728, filed Jun. 19, 2018, Managed NAND Cold Data Storage.

(Continued)

*Primary Examiner* — Michael Alsip
(74) *Attorney, Agent, or Firm* — Schwegman Lundberg & Woessner, P.A.

(57) ABSTRACT

Apparatus and methods are disclosed, including identifying and tagging data in a group of volatile memory cells of a host device to be written to and maintained contiguously on non-volatile memory of a storage system, and writing the tagged data to the group of non-volatile memory cells. A host device includes a host processor and the group of volatile memory cells, and a storage system includes the group of non-volatile memory cells.

28 Claims, 6 Drawing Sheets

(56) References Cited

U.S. PATENT DOCUMENTS

| | | |
|---|---|---|
| 2013/0326186 A1* | 12/2013 | Shaikh ................ G06F 9/45558 |
| | | 711/170 |
| 2014/0189421 A1 | 7/2014 | Werner et al. |
| 2016/0179375 A1 | 6/2016 | Kirvan et al. |
| 2016/0313916 A1 | 10/2016 | Sivananainthaperumal et al. |
| 2017/0255417 A1 | 9/2017 | Dain et al. |
| 2018/0364918 A1 | 12/2018 | Jean |
| 2018/0364947 A1 | 12/2018 | Jean |

OTHER PUBLICATIONS

U.S. Appl. No. 16/012,750, filed Jun. 19, 2018, Managed NAND Data Compression.

* cited by examiner

MANAGED NAND DATA TAGGING

CLAIM OF PRIORITY

This application claims the benefit of priority under 35 U.S.C. § 119(e) of U.S. Provisional Patent Application Ser. No. 62/521,939, filed on Jun. 19, 2017, which is herein incorporated by reference in its entirety.

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
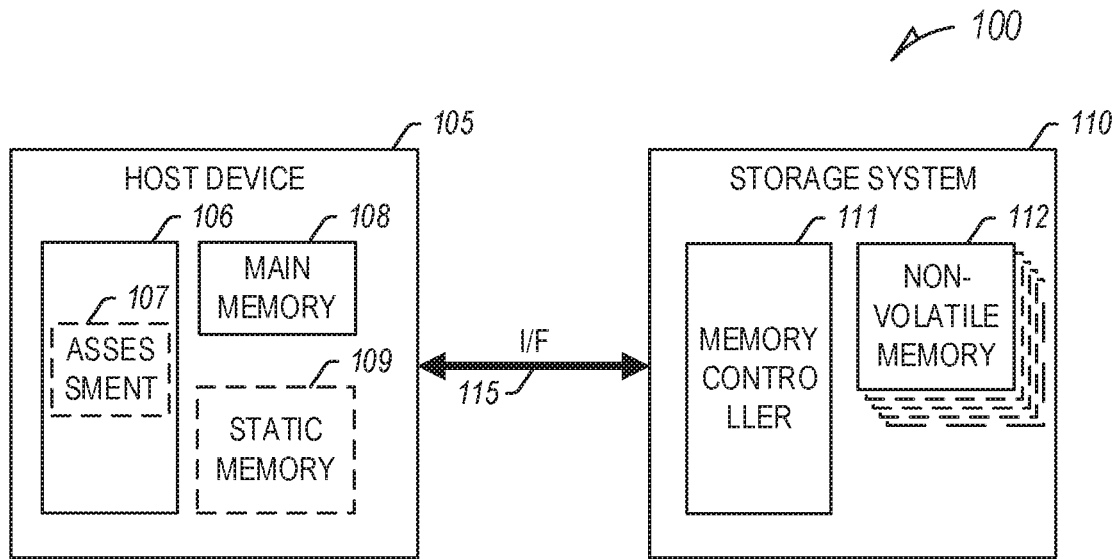
FIG. 1 illustrates an example host system including a host device and a storage system.

Software (e.g., programs), instructions, operating systems (OS), and other data are typically stored on storage systems and accessed by main memory for use by a host processor. Main memory (e.g., RAM) is typically faster, more expensive, and a different type of memory device (e.g., volatile) than a majority of the memory devices of the storage system (e.g., non-volatile, such as an SSD, etc.). In addition to the main memory, host systems can include different levels of volatile memory, such as a group of static memory (e.g., a cache, often SRAM), often faster than the main memory, in certain examples, configured to operate at speeds close to or exceeding the speed of the host processor, but with lower density and higher cost. In other examples, more or less levels or quantities of main memory or static memory can be used, depending on desired host system performance and cost.

When the static memory is full, various replacement policies can be implemented to free static memory to improve system performance, often writing a portion of the static memory to the main memory or erasing that portion of the static memory depending on one or more factors, including least recently used (LRU) data, most recently used (MRU) data, first in first out (FIFO) data, last in first out (LIFO) data, least frequently used (LFU) data, random replacement (RR) data, etc.

When the main memory is full, virtual space from the storage system can be allocated to supplement the main memory. Because the storage system is slower than the main memory, use of virtual memory can greatly reduce user experience due to storage system latency (in contrast to the main memory). Further, use of the storage system for virtual memory can greatly reduce the usable lifespan of the storage system.

In contrast to virtual memory, virtual memory compression (e.g., as in ZRAM or ZSWAP) can use part of the main memory as compressed block storage to avoid paging to the storage system. In virtual memory compression, paging can take place in the compressed block (e.g., from cache or SRAM to DRAM) until it is necessary to write such data to the storage system. Virtual memory compression increases the usable size of the main memory, while reducing wear on the storage system. However, compression requires host processor time and cycles to compress the data, reducing host system performance.

The present inventor has recognized, among other things, that, to avoid excess wear on the storage system, inactive or cold data from the main memory or the static memory can be written to the storage system, separate from or in addition to virtual memory compression, as necessary. For example, cold data can be identified in the static or main memory, compressed, and written to the storage system. In other examples, cold data can be written to the storage system without being compressed.

In certain examples, cold data can include data detected as least recently used (LRU) data in the static or main memory. In other examples, cold data can include data that is inactive, unused, or has remained unchanged for a period of time (e.g., an open but unused mobile device application (inactive), background applications, data lingering for days, time of data, time since device was last physically moved (using accelerometer data), phone facing down or in purse or pocket, etc.). In other examples, cold data can include data that has been unused or has remained unchained longer than other data in the static or main memory, in certain examples, in combination with one or more other factors. For example, the host processor can identify data of higher or lower priority based on current or past usage (e.g., whether or not the data changes after being loaded into the main memory, how often the data is accessed once loaded into the main memory, etc.), or the amount of time or clock cycles required to build or load the data into the static or main memory, and in certain examples, determine a priority for one or more groups of data written to the static or main memory, such as using the host device, the host processor, or assessment circuitry (including software, microcode, instructions, etc.) associated with the host device.

If data is frequently accessed or requires more host processor time or resources to build or load into the static or main memory (e.g., clock cycles, total time between beginning an operation associated with the data and a subsequent waiting time or idle time (excluding stalled time, for example, waiting for the storage system), etc.), the host processor can assign a higher priority to retain the data. If data is not frequently accessed or requires less host processor time or resources to build or load into the main memory, the host processor can assign a lower priority to retain the data.

In other examples, cold data can include data associated with specific programs or applications that infrequently access the main memory, such that the time to retrieve cold data from the storage system is less burdensome to host system performance than the burden associated with storing the data on the main memory.

Cold data can include data identified, marked, or received as cold data, such as from a user (e.g., through a user interface), a program, the host processor, etc. In certain examples, certain data only requires limited reads. For example, downloading or streaming a movie requires. Cold data can include compressed data (e.g., in ZRAM) or uncompressed data (e.g., in DRAM). To reduce wear on one or more memory devices of the storage system, cold data can be accumulated and moved to the storage system in large, sequential, streaming blocks or offload unit (OU). In certain examples, such blocks or offload units can be tagged (e.g., in the metadata, in the user data, etc.) or otherwise identified to be stored contiguously on the storage system, not to be broken up or moved in one or more storage system management operation (e.g., wear leveling, garbage collection, etc.), such as to take advantage of efficient, high-speed data transfer from contiguous locations of the storage system. Tagged data can include one large write, or a number of smaller writes sharing the same tag and assembled together. In other examples, new commands (new read commands, write commands, etc.) can be provided to tag, accumulate, or instruct the storage system to perform one or more specific operations. In other examples, the command size can act as a tag.

Further, when tagged or otherwise identified data is read from the storage system back to the host device, the storage system can prioritize commands associated with such tagged or otherwise identified data to reduce latency. The storage system can also pre-fetch associated data prior to receiving additional read commands. For example, if the host processor identifies and tags multiple blocks or offload units for a specific application, and the first block or offload unit is requested by the host processor in a read command, the storage system can pre-fetch remaining blocks or offload units prior to receiving a read request. The host processor can monitor operations and tag associated data, or data frequently created together, or associated with common host device operations. Further, the storage system can track statistics on the tagged data to determine patterns or to group independently tagged chunks, blocks, or offload units.

In an example, instead of a number of smaller data operations, a smaller number of operations encompassing a larger amount of data (and less overhead) can be used to transfer the cold data in the block or offload unit to contiguous areas of the storage system. In other examples, partial blocks or other small operations of cold data smaller than an offload unit can be supported, though in certain examples, less efficiently. In an example, a majority or all of a block or offload unit can be filled prior to writing the block or offload unit to the storage system. In an example, a threshold amount of the block or offload unit must be filled prior to writing the block or offload unit to the storage system. In an example, a threshold can include a relative size of the block or the offload unit, such that identified or associated data no longer fits on the block or offload unit being assembled. In other examples, a threshold amount of data can be enforced, such as greater than 128 k (e.g., 512 KB, 1 MB, etc). It can be more efficient to transfer larger amounts of data (e.g., 1 MB-4 MB).

Compressed or uncompressed cold data on the storage system can be restored to the main memory, static memory, or a compressed portion of main memory (e.g., ZRAM), on demand or based on a specific trigger. In certain examples, when even a portion of the cold data is read, requested, or accessed on the storage system, all of the block or offload unit of cold data can be restored. In an example, such as on a mobile device (e.g., an Android smart phone or other handheld device), a trigger to restore cold data can include when a user unlocks the mobile device, opens the app picker to switch foreground applications on the mobile device, takes a phone out of a pocket or purse, picking up a phone off a table, picking up a phone that was face down, or closes an application on the mobile device.

In other examples, inactive data can be assembled and moved to the storage system in response to various triggers, such as when an application is moved from the foreground of a display to the background, or when the application is closed. In other examples, the host device can implement a delay (e.g., hysteresis) to avoid triggering too often. Other triggers can include one or more component of the host system entering a low-power mode, such as the host processor, the memory controller, user interface, screen, battery, etc.

In an example, a trigger can include a state of a battery of the host system. For example, if the battery is low, the host processor could more aggressively identify, assemble, and write inactive data to the group of non-volatile memory cells. In certain examples, it can be beneficial to offload unneeded material and turn off portions of the main memory to conserve power. For example, if a host device has 3 BG of DRAM, but the current app only needs 1 GB, then 2 GB can be offloaded, saving power, and reloaded as soon as a user opens the "app switcher" or otherwise triggers the phone or picks another foreground app to add. In addition, the more data written to the non-volatile memory, the less time required to save/flush information if there is a sudden drop in battery level that can be caused by peak demand, temperature change on the battery, etc.

Cold data storage can be supported at the kernel level of the host processor, and can access the storage system directly, such as to focus on large, efficient block operations to the storage system, utilizing existing storage system optimization designed for other large media operations (e.g., 4 k video capture, HD video files, streaming media, augmented reality, virtual reality, etc.). Data from the storage system can be restored to main memory or the compressed portion of main memory (e.g., ZRAM) on demand or based on one or more triggers.

Cold data storage can be used to retain executable snapshots of programs that have already been loaded. When an application on the host processor starts up for the first time (and often more frequently than initial startup), code can be executed to initialize data structures in the main memory. The assessment circuitry can detect these data structures as groups of associated data and determine a priority for the associated data, in certain examples, depending on a time since last access, a typical behavior associated with the application, etc. In certain examples, frequently used or otherwise defined programs can be stored in a post-initialized state in cold data storage (e.g., as compressed data in ZRAM, or as compressed or uncompressed data in the storage system) for convenient or efficient allocation to the active portion of the memory. In an example, cold data can include (or cold data storage can be used for) any data that is not expected to change frequently (e.g., detected or identified by the processor or defined by a user, process, or program), but can be loaded efficiently in one operation (or in certain examples, in one or more operations, such as using one or more large, efficient block operations, etc.).

Host systems, such as mobile electronic devices with small or large amounts of volatile memory (e.g., DRAM) can benefit from a managed combination of volatile memory, non-volatile memory, and cold data storage (Cold Cache), providing more memory for normal applications, enabling a smoother, more responsive, better user experience. Users may no longer be required or prompted to close applications no longer in use to free up memory. Further, when old data, such as a cold application, is brought back into active memory, the load time will be considerably faster than the conventional time required to load or initialize such data.

FIG. 1 illustrates an example system (e.g., a host system) 100 including a host device 105 and a storage system 110 configured to communicate over a communication interface (I/F) 115 (e.g., a bidirectional parallel or serial communication interface). The host device 105 can include a host processor 106 (e.g., a host central processing unit (CPU) or other processor or processing device) or other host circuitry (e.g., a memory management unit (MMU), interface circuitry, assessment circuitry 107, etc.). In certain examples, the host device 105 can include a main memory 108 (e.g., DRAM, etc.) and optionally, a static memory 109, to support operation of the host processor 106.

The storage system 110 can include a universal flash storage (UFS) device, an embedded MMC (eMMC™) device, or one or more other memory devices. For example, if the storage system 110 includes a UFS device, the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, if the storage system 110 includes an eMMC device, the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage system 110 can include one or more other memory devices, or the communication interface 115 can include one or more other interfaces, depending on the host device 105 and the storage system 110.

The storage system 110 can include a memory controller 111 and a non-volatile memory 112. In an example, the non-volatile memory can include a number of memory devices (e.g., dies or LUNs), such as one or more flash memory devices, etc., each including periphery circuitry thereon, and controlled by the memory controller 111.

Flash memory devices typically include one or more groups of one-transistor, floating gate memory cells. Two common types of flash memory array architectures include NAND and NOR architectures. The floating gate memory cells of the memory array are typically arranged in a matrix. The gates of each memory cell in a row of the array are coupled to an access line (e.g., a word line). In NOR architecture, the drains of each memory cell in a column of the array are coupled to a data line (e.g., a bit line). In NAND architecture, the drains of each memory cell in a column of the array are coupled together in series, source to drain, between a source line and a bit line.

Each memory cell in a NOR, NAND, 3D Cross Poitn (Xpoint), Holographic RAM (HRAM), MRAM, or one or more other architecture semiconductor memory array can be programmed individually or collectively to one or a number of programmed states. A single-level cell (SLC) can represent one bit of data per cell in one of two programmed states (e.g., 1 or 0). A multi-level cell (MLC) can represent two or more bits of data per cell in a number of programmed states (e.g., $2^n$, where n is the number of bits of data). In certain examples, MLC can refer to a memory cell that can store two bits of data in one of 4 programmed states. A triple-level cell (TLC) can represent three bits of data per cell in one of 8 programmed states. A quad-level cell (QLC) can represent four bits of data per cell in one of 16 programmed states. In other examples, MLC can refer to any memory cell that can store more than one bit of data per cell, including TLC and QLC, etc.

The storage system 110 can include a multimedia card (MMC) solid-state storage device (e.g., micro secure digital (SD) cards, etc.). MMC devices include a number of parallel interfaces (e.g., an 8-bit parallel interface) with a host device 105, and are often removable and separate components from the host device. In contrast, embedded MMC (eMMC) devices are attached to a circuit board and considered a component of the host device, with read speeds that rival serial ATA (SATA) based SSD devices. As demand for mobile device performance continues to increase, such as to fully enable virtual or augmented-reality devices, utilize increasing networks speeds, etc., storage systems have shifted from parallel to serial communication interfaces. UFS devices, including controllers and firmware, communicate with a host device using a low-voltage differential signaling (LVDS) serial interface with dedicated read/write paths, further advancing read/write speeds between a host device and a storage system.

In three-dimensional (3D) architecture semiconductor memory device technology, vertical floating gate or charge trapping storage structures can be stacked, increasing the number of tiers, physical pages, and accordingly, the density of memory cells in a memory device.

Data is often stored arbitrarily on the storage system as small units. Even if accessed as a single unit, data can be received in small, random 4-16 k single file reads (e.g., 60%-80% of operations are smaller than 16 k). It is difficult for a user and even kernel applications to indicate that data should be stored as one sequential cohesive unit. File systems are typically designed to optimize space usage, and not sequential retrieval space.

The memory controller 111 can receive instructions from the host device 105, and can communicate with the non-volatile memory 112, such as to transfer data to (e.g., write or erase) or from (e.g., read) one or more of the memory cells of the non-volatile memory array 112. The memory controller 111 can include, among other things, circuitry or firmware, such as a number of components or integrated circuits. For example, the memory controller 111 can include one or more memory control units, circuits, or components configured to control access across the memory array and to provide a translation layer between the host device 105 and the storage system 100.

The non-volatile memory array 112 (e.g., a 3D NAND architecture semiconductor memory array) can include a number of memory cells arranged in, for example, a number of devices, planes, blocks, or physical pages. As one example, a TLC memory device can include 18,592 bytes (B) of data per page, 1536 pages per block, 548 blocks per plane, and 4 planes per device. As another example, an MLC memory device can include 18,592 bytes (B) of data per page, 1024 pages per block, 548 blocks per plane, and 4 planes per device, but with half the required write time and twice the program/erase (P/E) cycles as a corresponding TLC memory device. Other examples can include other numbers or arrangements.

In operation, data is typically written to or read from the storage system 110 in pages and erased in blocks. However, one or more memory operations (e.g., read, write, erase, etc.) can be performed on larger or smaller groups of memory cells, as desired. For example, a partial update of tagged data from an offload unit can be collected during data migration or garbage collection to ensure it was re-written efficiently. The data transfer size of a memory device is typically referred to as a page, whereas the data transfer size of a host device is typically referred to as a sector. Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, an MLC NAND flash device may have a higher bit error rate than a corresponding SLC NAND flash device. As such, the MLC device may require more metadata bytes for error data than the corresponding SLC device.

The present inventor has recognized, among other things, a bulk storage mechanism to load and store data. In an example, such bulk storage mechanism can utilize existing non-volatile memory (NVM) storage sequential/streaming processing capabilities, which have higher bandwidth capabilities than random read/write operations (e.g., >60K input-output performance (IOP) random capability, etc.). Accordingly, information to be used together, either identified as frequently being read together, or otherwise identified as such (e.g., from a user, program, or process, such as AI overlay, cellular modem profiles, cellular handover data, cellular modem data, etc.), can be stored contiguously (e.g., across a super block, etc.) on the storage system and managed as one data unit. These blocks may be termed "chunks" or "offload units" (OUs). Operations can be aggregated to utilize the storage system ability to perform batch operations by reading and writing all data within a chunk or offload unit. The host processor and storage system can batch operations for efficiency. In an example, such mechanism can be beneficial for data that is read frequently and written infrequently. As more memory is freed for normal operation, less caching is required, enabling a smoother, more responsive, user experience.

Further, as sequential bandwidth is easier and faster to apply within the system, including between the host device 105 and the storage system 110, in certain examples, such information can be read/written sequentially to optimize transfer at high speeds (e.g., 1.8 GB/s read, 120-800 MB/s write, etc.).

In an example, the data in the chunk or offload unit can be handled in an optimized manner throughout its tenure on the storage system. For example, the data is managed as one unit during data migration (e.g., garbage collection, etc.) such that the efficient read/write properties are preserved as data is moved to its new physical location on the storage system. In certain examples, the only limit to the number of chunks, offload units, or blocks configurable for storage, tagging, etc., are the capacities of the system.

In an example, a super block can refer to one block on each side of a die. If a die has 4 planes, the system has 4 channels. Each channel can include 2 tie for a total of 8 die in the system. A write to a super block, in this example, can go to 1 die per channel, on each plane.

Many host systems, such as mobile electronic devices (e.g., smart phones, tablets, Internet-of-things (IOT) devices, etc.), can be characterized by periods of heavy use (e.g., bursts) followed by periods (often longer) of relative inactivity (e.g., 5% active to 95% inactive, 10% active to 90% inactive, etc.). Even during periods of light user activity, the storage system can remain idle (e.g., for 100 s of milliseconds). As many storage systems include powerful memory controllers to manage the one or more memory devices (e.g., 600 MHz or greater, etc.), the present inventor has recognized, among other things, that data operations traditionally performed by a host processor (e.g., a central processing unit (CPU), an application processor, a management unit, or one or more other processors or circuitry of a host system, etc.) can be performed by the memory controller. In certain examples, the processing power of the memory controller an act as a shared processor pool for the host device.

The present inventor has recognized, among other things, that data operations traditionally performed by the host processor can be performed directly in the storage system, such as using a memory controller of the storage system (e.g., an SSD controller), for example, in periods of inactivity or low required storage-device activity. As the bulk of data in a host system typically resides in the storage system, it is most efficient to do operations on the memory device. To complete data operations, the host processor typically loads data from the storage system into main memory, which requires time, clock cycles, power associated with the main memory (e.g., DRAM), and causes interface traffic between the host device and the storage system.

For example, setting large memory arrays to all zero values can be expensive when executed by the host processor (e.g., time consuming, requiring excess power, clock signals, activity, etc.). The desired data must be read from the storage system, transferred over a bus, loaded into a register (e.g., of the host processor), set, transferred back, then stored. In contrast, the host processor could send a single instruction to storage system to request that a range is zeroed, overwritten, moved, etc., by the memory controller (e.g., SSD controller, etc.). In other examples, other more complex operations are possible, configured to offload the host processor for other operations. For example, the memory controller can provide a list of available operations to the host device. The host device can then identify data operations to be performed by the storage system, reducing bus traffic, improving host processor performance, and reducing energy use, etc.

The concept can be applied to any storage system having one or more dedicated memory controllers or processors to manage the storage systems (e.g., NVM, SSD, Raw NAND, etc.). A set of operations can be pre-defined or submitted at runtime by the host processor (e.g., in executable code using Pearl or python, etc.). Examples include: move, duplicate, trigger (if A, then B), pre-fetch, pattern fill, set bits, find pattern, encryption or decryption (e.g., device-side), compression, decompression, etc. The memory controller can be triggered as needed to offload the host processor, improve device or processor performance, reduce latency, reduce bus traffic, or reduce power usage by the mobile electronic device.

In certain examples, the operations to be performed by the memory controller can be performed as soon as they are requested by the host processor. In other examples, the storage system can wait to perform requested operations until idle time. In other examples, the memory controller can log the requested operation and execute the action on the fly, as the host device requests data from the storage system. For example, if the memory controller receives a request to decompress compressed data. The memory controller could store a compressed copy, perform decompression, store the decompressed copy, and wait for retrieval of the compressed or decompressed version of the received data. Once one is removed from memory, the other can be erased. In other examples, the compressed version of the received data can be stored on the storage system (e.g., to save space), and then decompressed as the host system requests the received data.

In other examples, the host device can write data to the storage system, and then later request an operation be performed on the written data. In an example, requested operations can be received as typical memory operations, or the host processor can apply modes to logical block address (LBA) ranges. A write to a first LBA range can be associated with a first operation. A write to a second LBA range can be associated with a second operation.

Figure 2:
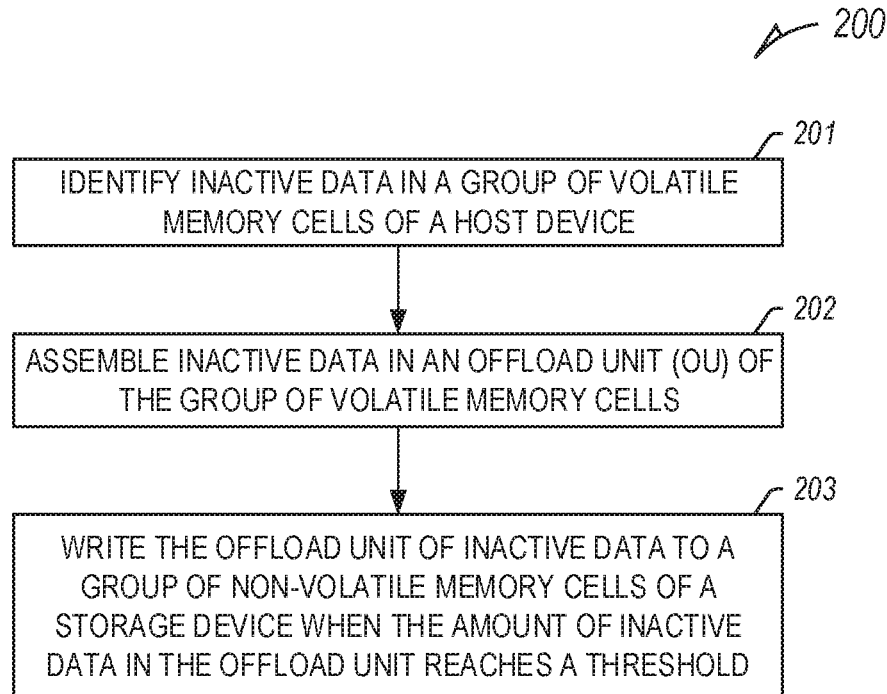
FIG. 2 illustrates an example method of assembling inactive data.

FIG. 2 illustrates an example method 200 including assembling inactive data. At 201, inactive data in a group of volatile memory cells of a host device can be identified, such as by a host processor, an assessment circuit, etc. At 202, identified inactive data can be assembled in an offload unit of the group of volatile memory cells.

At 203, the offload unit of inactive data can be written to a group of non-volatile memory cells of a storage system, such as in response to one or more triggers. In an example, when the amount of inactive data in the offload unit reaches a threshold, the data can be written. In other examples, one or more other triggers can be used, such as static or main memory capacity, battery status, low power mode, background status, user inputs being turned off, etc.

In certain examples, the offload unit can include a block of memory cells. In other examples, the offload unit can be dynamic, or can comprise a number of blocks with a common designation, such as a tag.

Figure 3:
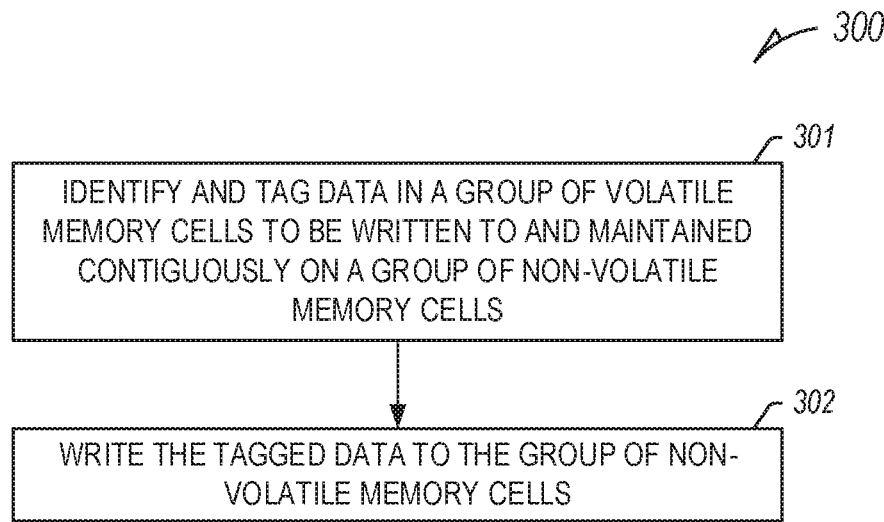
FIG. 3 illustrates an example method of identifying and tagging data.

FIG. 3 illustrates an example method 300 including identifying and tagging data. At 301, data in a group of volatile memory cells of a host device can be identified and tagged to be written to and maintained contiguously on non-volatile memory of a storage system, such as to maintain efficient, high-throughput, data transfer into and out of the storage system.

At 302, the tagged data can be written to the group of non-volatile memory cells. In an example, tagged data, prior to being written to the group of non-volatile memory cells, can be assembled in an offload unit of the group of volatile memory cells.

Multiple smaller files with the same tag can be treated as one larger unit and maintained together, such as during internal data migration. In other examples, if data that was tagged is partially updated and spread inefficiently across several blocks, it can be reassembled using the tags and stored efficiently during normal data migration process. When the amount of inactive data in the offload unit reaches a threshold, or one or more other trigger are satisfied, the offload unit of inactive data can be written to the group of non-volatile memory cells of the storage system.

Figure 4:
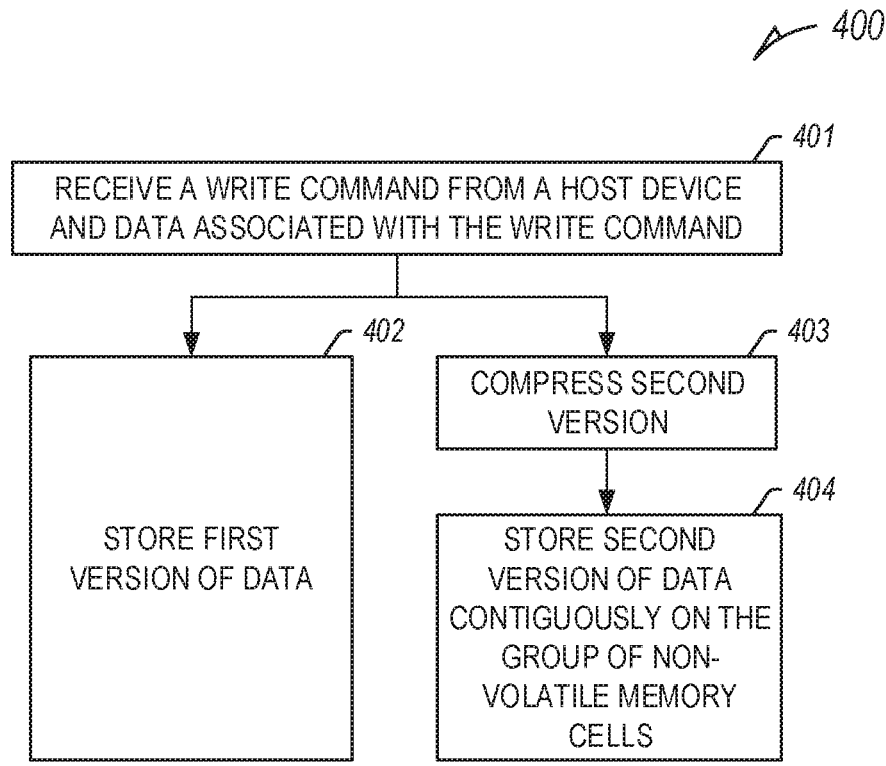
FIGS. 4-5 illustrate example methods of storing compressed and uncompressed data.

FIG. 4 illustrates an example method 400 including storing compressed and uncompressed data. At 401, a write command and data associated with the write command are received from a host device. At 402, a first version of data associated with the write command is stored on a group of non-volatile memory cells of a storage system.

At 403, a second version of the data associated with the write command can be compressed. In certain examples, compression can occur at the time the storage system receives the data. In other examples, the storage system can wait to perform compression until idle time of the memory controller or one or more die of the storage system. In an example, the storage system can wait until the host device or the host processor requests the compressed data. At 404, once compression has occurred, the compressed second version of the data can be stored on the group of non-volatile memory cells. The host device can then decide to request the uncompressed first version of the data, the compressed second version of the data, or instruct the storage system to discard one of the first or second versions.

Figure 5:
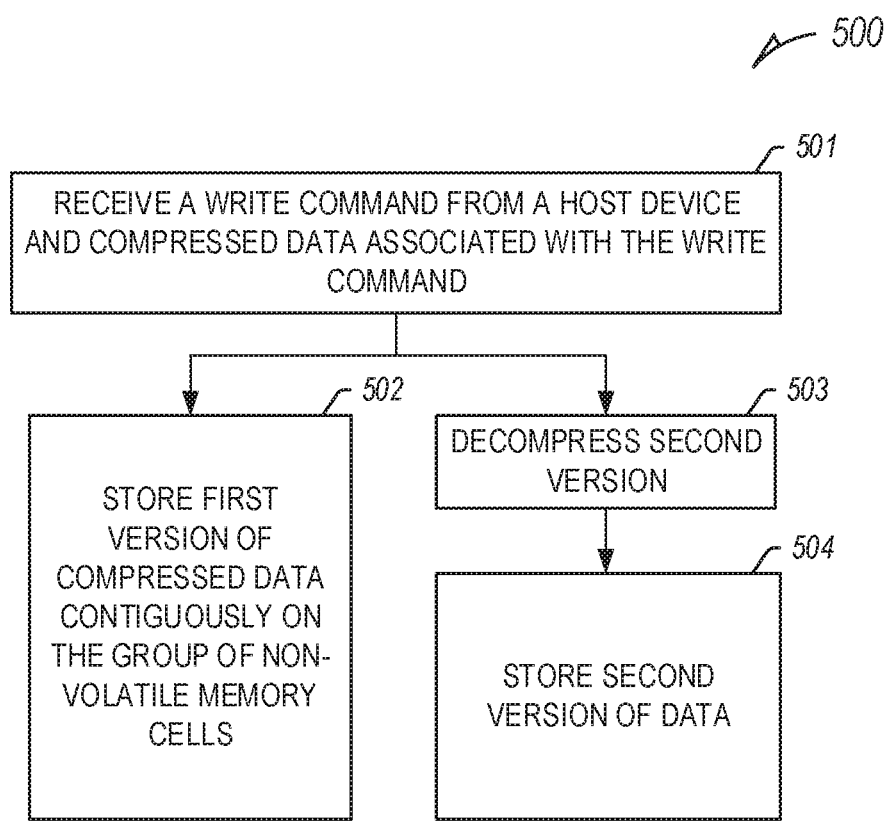

FIG. 5 illustrates an example method 500 including storing compressed and uncompressed data. At 501, a write command and compressed data associated with the write command are received from a host device. At 502, a first version of the compressed data associated with the write command is stored and maintained contiguously on a group of non-volatile memory cells.

At 503, a second version of the compressed data associated with the write command is decompressed. The data can be decompressed as it is received, at idle time, or when the host device or host processor requests the decompressed data. At 504, once decompression has occurred, the decompressed second version of the data can be stored on the group of non-volatile memory cells. The host device can then decide to request the first version of the compressed data, the decompressed second version of the data, or instruct the storage system to discard one of the first or second versions.

In other examples, a storage system processor can provide available operations to a host processor. The host processor can identify data operations to be performed by the storage system processor. Identified data operations can be assigned to the storage system processor, such as to reduce bus traffic between the host processor and the storage system processor, to improve host processor performance, or to reduce energy use by the host processor.

Similar to above, the assigned data operations can be performed as received, at idle time, at the time of response, or one or more other.

Figure 6:
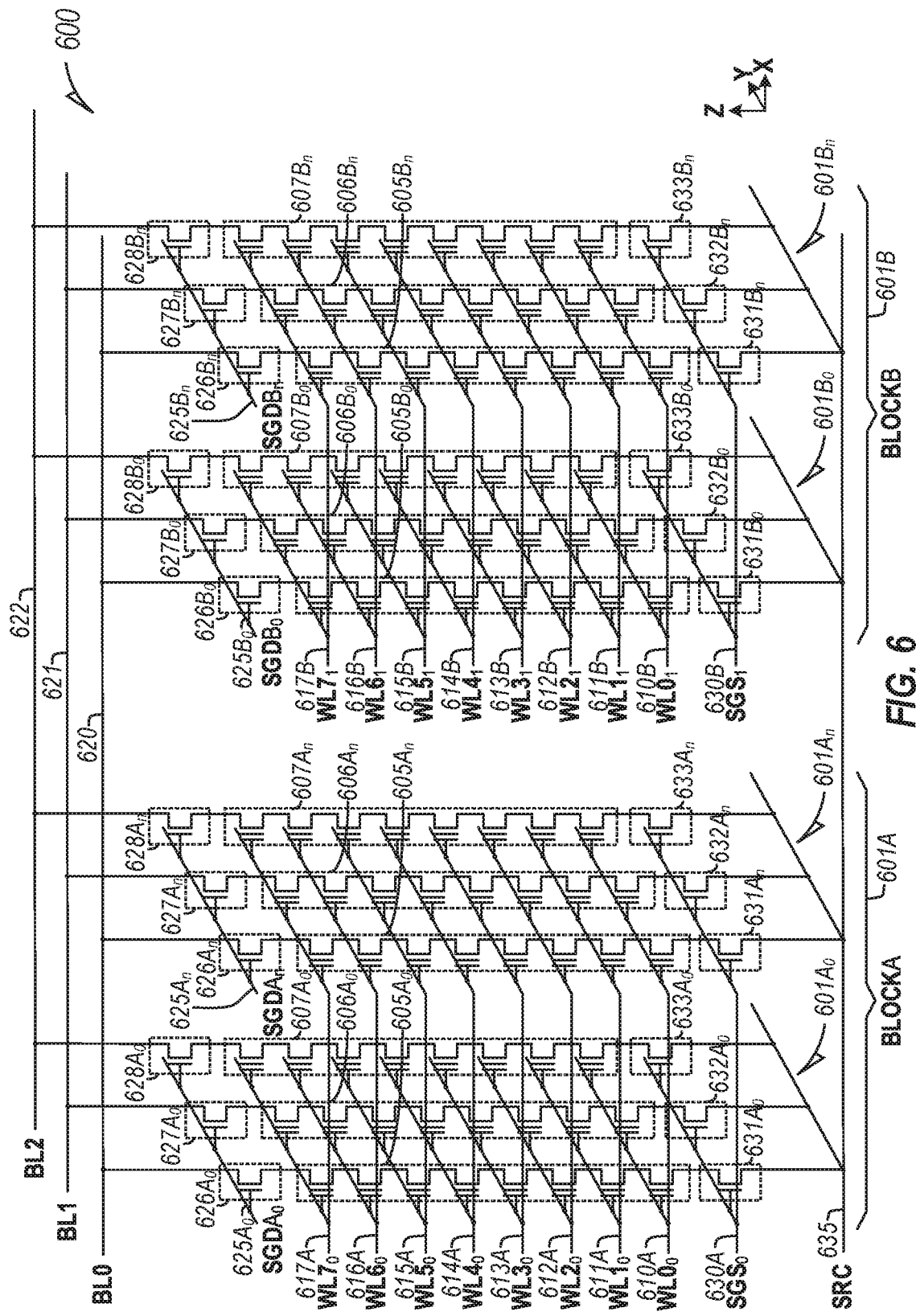
FIG. 6 illustrates an example schematic diagram of a 3D NAND architecture semiconductor memory array.

FIG. 6 illustrates an example schematic diagram of a 3D NAND architecture semiconductor memory array 600 including a number of strings of memory cells (e.g., first-third $A_0$ memory strings 605$A_0$-607$A_0$, first-third $A_n$ memory strings 605$A_n$-607$A_n$, first-third $B_0$ memory strings 605$B_0$-607$B_0$, first-third $B_n$ memory strings 605$B_n$-607$B_n$, etc.), organized in blocks (e.g., block A 601A, block B 601B, etc.) and sub-blocks (e.g., sub-block $A_0$ 601$A_0$, sub-block A, 601$A_n$, sub-block $B_0$ 601$B_0$, sub-block $B_n$ 601$B_n$, etc.). The memory array 600 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 635 or a source-side select gate (SGS) (e.g., first-third $A_0$ SGS 631$A_0$-633$A_0$, first-third $A_n$ SGS 631$A_n$-633$A_n$, first-third $B_0$ SGS 631$B_0$-633$B_0$, first-third $B_n$ SGS 631$B_n$-633$B_n$, etc.) and a drain-side select gate (SGD) (e.g., first-third $A_0$ SGD 626$A_0$-628$A_0$, first-third $A_n$ SGD 626$A_n$-628$A_n$, first-third $B_0$ SGD 626$B_0$-628$B_0$, first-third $B_n$ SGD 626$B_n$-628$B_n$, etc.). Each string of memory cells in the 3D memory array can be arranged along the X direction as data lines (e.g., bit lines (BL) BL0-BL6 620-622), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 600 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 600 includes a control gate (CG) coupled to (e.g., electrically or otherwise operatively connected to) an access line (e.g., word lines (WL) $WL0_0$-$WL7_0$ 610A-617A, $WL0_1$-$WL7_1$ 610B-617B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 626$A_0$-628$A_0$ can be accessed using an $A_0$ SGD line SGDA$_0$ 625$A_0$, first-third $A_n$ SGD 626$A_n$-628$A_n$ can be accessed using an $A_n$ SGD line SGDA$_n$ 625$A_n$, first-third $B_0$ SGD 626$B_0$-628$B_0$ can be accessed using an $B_0$ SGD line SGDB$_0$ 625$B_0$, and first-third $B_n$ SGD 626$B_n$-628$B_n$ can be accessed using an $B_n$ SGD line SGDB$_n$ 625$B_n$. First-third $A_0$ SGS 631$A_0$-633$A_0$ and first-third $A_n$ SGS 631$A_n$-633$A_n$ can be accessed using a gate select line SGS$_0$ 630A, and first-third $B_0$ SGS 631$B_0$-633$B_0$ and first-third $B_n$ SGS 631$B_n$-633$B_n$ can be accessed using a gate select line SGS$_1$ 630B.

In an example, the memory array 600 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

In a NAND architecture semiconductor memory array, the state of a selected memory cell can be accessed by sensing a current or voltage variation associated with a particular data line containing the selected memory cell. The memory array 600 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4$_0$), and thus, to a control gate of each memory cell coupled to the selected word lines. Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) applied to a specific word line, such as $WL4_0$, a pass voltage of 10V can be applied to one or more other word lines, such as $WL3_0$, $WL5_0$, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to $WL4_0$, a pass voltage of 10V can be applied to $WL3_0$ and $WL5_0$, a pass voltage of 8V can be applied to $WL2_0$ and $WL6_0$, a pass voltage of 7V can be applied to $WL1_0$ and $WL7_0$, etc. In other examples, the pass voltages, or number of word lines, etc., can be higher or lower, or more or less.

Sense amplifiers can be coupled to one or more of the data lines (e.g., first, second, or third bit lines (BL0-BL2) 620-622), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 7:
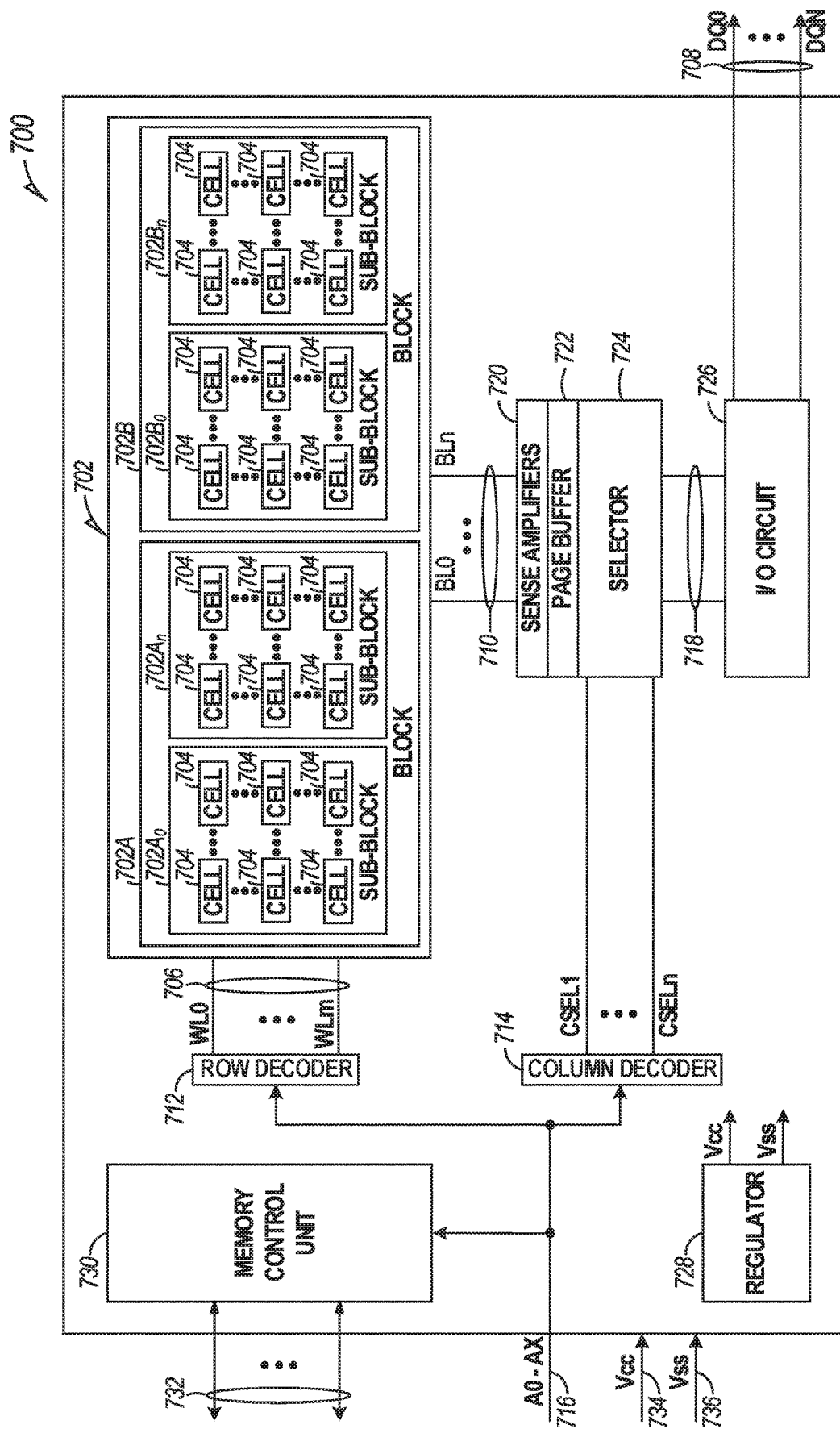
FIG. 7 illustrates an example block diagram of a memory module.

FIG. 7 illustrates an example block diagram of a memory device 700 including a memory array 702 having a plurality of memory cells 704, and one or more circuits or components to provide communication with, or perform one or more memory operations on, the memory array 702. Although shown with a single memory array 702, in other examples, one or more additional memory arrays, dies, or LUNs can be included herein. In certain examples, in a storage system having a number of dies or LUNs, the memory device 700 can represent a block diagram of circuits and components for each die or LUN. The memory device 700 can include a row decoder 712, a column decoder 714, sense amplifiers 720, a page buffer 722, a selector 724, an input/output (I/O) circuit 726, and a memory control unit 730.

The memory cells 704 of the memory array 702 can be arranged in blocks, such as first and second blocks 702A, 702B. Each block can include sub-blocks. For example, the first block 702A can include first and second sub-blocks $702A_0$, $702A_n$, and the second block 702B can include first and second sub-blocks $702B_0$, $702B_n$. Each sub-block can include a number of physical pages, each page including a number of memory cells 704. Although illustrated herein as having two blocks, each block having two sub-blocks, and each sub-block having a number of memory cells 704, in other examples, the memory array 702 can include more or fewer blocks, sub-blocks, memory cells, etc. In other examples, the memory cells 704 can be arranged in a number of rows, columns, pages, sub-blocks, blocks, etc., and accessed using, for example, access lines 706, first data lines 710, or one or more select gates, source lines, etc.

The memory control unit 730 can control memory operations of the memory device 700 according to one or more signals or instructions received on control lines 732, including, for example, one or more clock signals or control signals that indicate a desired operation (e.g., write, read, erase, etc.), or address signals (A0-AX) received on one or more address lines 716. One or more devices external to the memory device 700 can control the values of the control signals on the control lines 732, or the address signals on the address line 716. Examples of devices external to the memory device 700 can include, but are not limited to, a host, a memory controller, a processor, or one or more circuits or components not illustrated in FIG. 7.

The memory device 700 can use access lines 706 and first data lines 710 to transfer data to (e.g., write or erase) or from (e.g., read) one or more of the memory cells 704. The row decoder 712 and the column decoder 714 can receive and decode the address signals (A0-AX) from the address line 716, can determine which of the memory cells 704 are to be accessed, and can provide signals to one or more of the access lines 706 (e.g., one or more of a plurality of word lines (WL0-WLm)) or the first data lines 710 (e.g., one or more of a plurality of bit lines (BL0-BLn)), such as described above.

The memory device 700 can include sense circuitry, such as the sense amplifiers 720, configured to determine the values of data on (e.g., read), or to determine the values of data to be written to, the memory cells 704 using the first data lines 710. For example, in a selected string of memory cells 704, one or more of the sense amplifiers 720 can read a logic level in the selected memory cell 704 in response to a read current flowing in the memory array 702 through the selected string to the data lines 710.

One or more devices external to the memory device 700 can communicate with the memory device 700 using the I/O lines (DQ0-DQN) 708, address lines 716 (A0-AX), or control lines 732. The input/output (I/O) circuit 726 can transfer values of data in or out of the memory device 700, such as in or out of the page buffer 722 or the memory array 702, using the I/O lines 708, according to, for example, the control lines 732 and address lines 716. The page buffer 722 can store data received from the one or more devices external to the memory device 700 before the data is programmed into relevant portions of the memory array 702, or can store data read from the memory array 702 before the data is transmitted to the one or more devices external to the memory device 700.

The column decoder 714 can receive and decode address signals (A0-AX) into one or more column select signals (CSEL1-CSELn). The selector 724 (e.g., a select circuit) can receive the column select signals (CSEL1-CSELn) and select data in the page buffer 722 representing values of data to be read from or to be programmed into memory cells 704. Selected data can be transferred between the page buffer 722 and the I/O circuit 726 using second data lines 718.

The memory control unit 730 can receive positive and negative supply signals, such as a supply voltage (Vcc) 734 and a negative supply (Vss) 736 (e.g., a ground potential), from an external source or supply (e.g., an internal or external battery, an AC-to-DC converter, etc.). In certain examples, the memory control unit 730 can include a regulator 728 to internally provide positive or negative supply signals.

Figure 8:
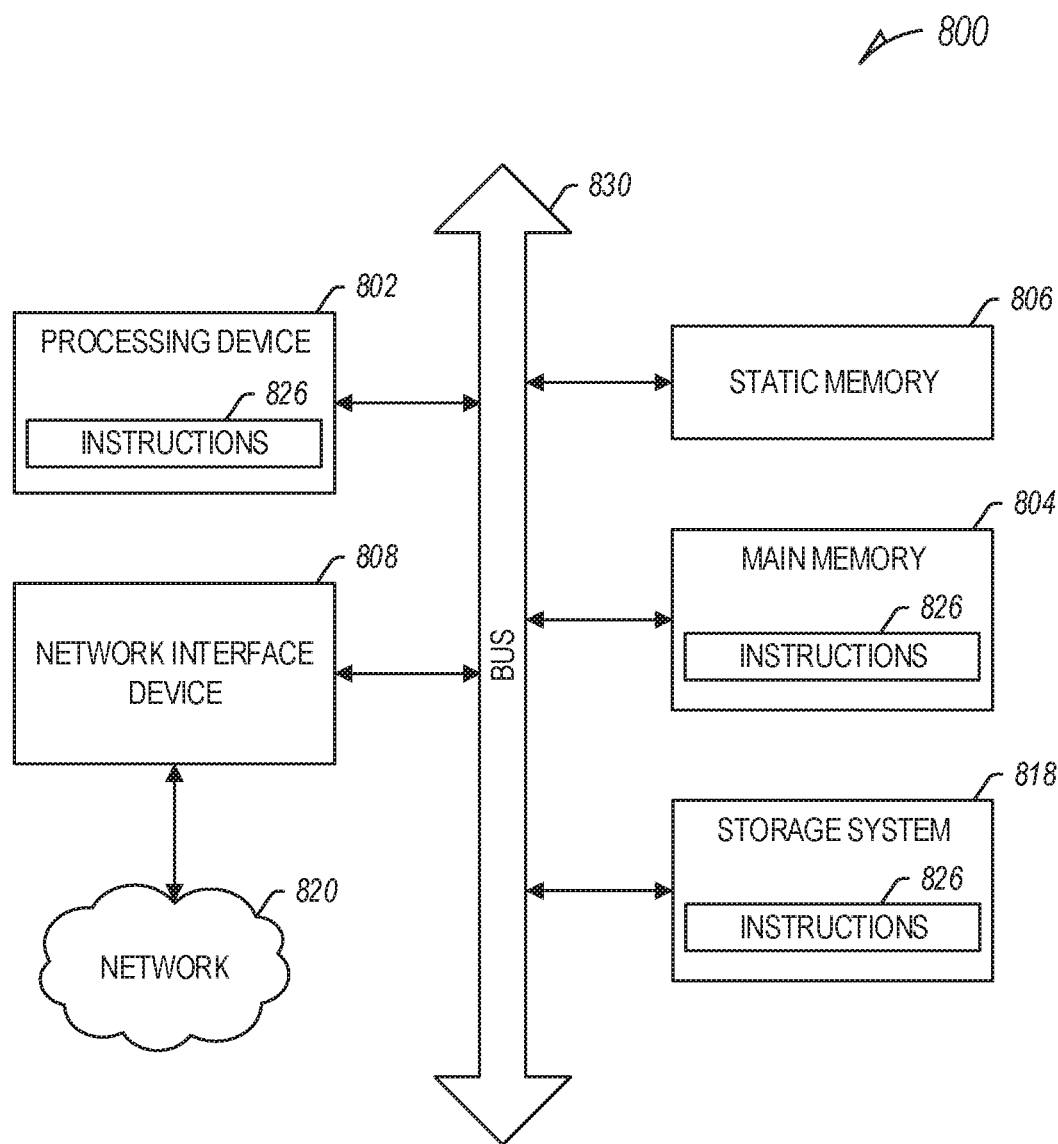
FIG. 8 illustrates an example block diagram of an information handling system.

FIG. 8 illustrates a block diagram of an example machine (e.g., a host system) 800 upon which any one or more of the techniques (e.g., methodologies) discussed herein may perform. In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 800 may include a processing device 802 (e.g., a hardware processor, a central processing unit (CPU), a graphics processing unit (GPU), a hardware processor core, or any combination thereof, etc.), a main memory 804 (e.g., read-only memory (ROM), dynamic random-access memory (DRAM) such as synchronous DRAM (SDRAM) or Rambus DRAM (RDRAM), etc.), a static memory 806 (e.g., static random-access memory (SRAM), etc.), and a storage system 818, some or all of which may communicate with each other via a communication interface (e.g., a bus) 830.

The processing device 802 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 802 can also be one or more special-purpose processing devices such as an application specific integrated circuit (ASIC), a field programmable gate array (FPGA), a digital signal processor (DSP), network processor, or the like. The processing device 802 can be configured to execute instructions 826 for performing the operations and steps discussed herein. The computer system 800 can further include a network interface device 808 to communicate over a network 820.

The storage system 818 can include a machine-readable storage medium (also known as a computer-readable medium) on which is stored one or more sets of instructions 826 or software embodying any one or more of the methodologies or functions described herein. The instructions 826 can also reside, completely or at least partially, within the main memory 804 or within the processing device 802 during execution thereof by the computer system 800, the main memory 804 and the processing device 802 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 800 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensors. The machine 800 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.)

The instructions 826 (e.g., software, programs, an operating system (OS), etc.) or other data are stored on the storage system 818 can be accessed by the main memory 804 for use by the processing device 802. The main memory 804 (e.g., DRAM) is typically fast, but volatile, and thus a different type of storage than the storage system 818 (e.g., an SSD), which is suitable for long-term storage, including while in an "off" condition. The instructions 826 or data in use by a user or the machine 800 are typically loaded in the main memory 804 for use by the processing device 802. When the main memory 804 is full, virtual space from the storage system 818 can be allocated to supplement the main memory 804; however, because the storage system 818 device is typically slower than the main memory 804, and write speeds are typically at least twice as slow as read speeds, use of virtual memory can greatly reduce user experience due to storage system latency (in contrast to the main memory 804, e.g., DRAM). Further, use of the storage system 818 for virtual memory can greatly reduce the usable lifespan of the storage system 818.

The instructions 824 may further be transmitted or received over a network 820 using a transmission medium via the network interface device 808 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 808 may include one or more physical jacks (e.g., Ethernet, coaxial, or phone jacks) or one or more antennas to connect to the network 820. In an example, the network interface device 808 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 800, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on"(in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Example 1 is a system comprising: a host device comprising a host processor and a group of volatile memory cells; and a storage system comprising a group of non-volatile memory cells; wherein the host processor is configured to: identify and tag data in the group of volatile memory cells to be written to and maintained by the storage system contiguously on the non-volatile memory; and write the tagged data to the group of non-volatile memory cells.

In Example 2, the subject matter of Example 1 is optionally configured such that the host processor is configured to: assemble tagged data in an offload unit of the group of volatile memory cells; and when the amount of inactive data in the offload unit reaches a threshold, write the offload unit of inactive data to the group of non-volatile memory cells of the storage system.

In Example 3, the subject matter of Example 2 is optionally configured such that the threshold is greater than 512 KB, and wherein the host processor is configured to write the tagged data to the group of non-volatile memory cells in a single write command.

In Example 4, the subject matter of Example 3 is optionally configured such that the threshold is greater than 1 MB.

In Example 5, the subject matter of any of Examples 1-4 is optionally configured such that the storage system is configured to: receive a write command for tagged identified data to be maintained contiguously on the group of non-volatile memory cells; and write and maintain the tagged identified data contiguously on the group of non-volatile memory cells.

In Example 6, the subject matter of any of Examples 1-5 is optionally configured such that to write and maintain the tagged identified data contiguously on the group of non-volatile memory cells comprises not separating the tagged identified data on the group of non-volatile memory cells during data migration or garbage collection.

In Example 7, the subject matter of any of Examples 1-6 is optionally configured such that, to write and maintain the tagged identified data contiguously, the storage system is configured to write the tagged identified data sequentially on a block.

In Example 8, the subject matter of any of Examples 1-7 is optionally configured such that, to write and maintain the tagged identified data contiguously, the storage system is configured to write the tagged identified data across a super block.

In Example 9, the subject matter of any of Examples 1-8 is optionally configured such that the host processor is configured to identify and tag user data to be maintained contiguously on the non-volatile memory for efficient recall back to the host device, and to prioritize read commands from the host processor of the tagged data to reduce latency.

In Example 10, the subject matter of any of Examples 1-9 is optionally configured such that the host processor is configured to identify and tag data structures initialized or read in response to a common event to be written and maintained by the storage system contiguously on the non-volatile memory.

Example 11 is a method comprising: identifying and tagging, using a host processor, data in a group of volatile memory cells of a host device to be written to and maintained contiguously on non-volatile memory of a storage system; and writing the tagged data to the group of non-volatile memory cells.

In Example 12, the subject matter of Example 11 is optionally configured to include assembling tagged data in an offload unit of the group of volatile memory cells; and when the amount of inactive data in the offload unit reaches a threshold, writing the offload unit of inactive data to the group of non-volatile memory cells of the storage system.

In Example 13, the subject matter of any of Examples 11-12 is optionally configured such that the threshold is greater than 512 KB, and the method comprises: writing the tagged data to the group of non-volatile memory cells in a single write command.

In Example 14, the subject matter of any of Examples 11-13 is optionally configured such that the threshold is greater than 1 MB.

In Example 15, the subject matter of any of Examples 11-14 is optionally configured to comprise: receiving a write command for tagged identified data to be maintained contiguously on the group of non-volatile memory cells; and writing and maintaining the tagged identified data contiguously on the group of non-volatile memory cells.

In Example 16, the subject matter of any of Examples 11-15 is optionally configured such that writing and maintaining the tagged identified data contiguously on the group of non-volatile memory cells comprises not separating the tagged identified data on the group of non-volatile memory cells during data migration or garbage collection.

In Example 17, the subject matter of any of Examples 11-16 is optionally configured such that writing and maintaining the tagged identified data contiguously comprises writing the tagged identified data sequentially on a block.

In Example 18, the subject matter of any of Examples 11-17 is optionally configured such that writing and maintaining the tagged identified data contiguously comprises writing the tagging identified data across a super block.

In Example 19, the subject matter of any of Examples 11-18 is optionally configured to comprise: identifying and tagging user data to be maintained contiguously on the non-volatile memory for efficient recall back to the host device; and prioritizing read commands from the host processor of the tagged data to reduce latency.

In Example 20, the subject matter of any of Examples 11-19 is optionally configured to comprise: identifying and tagging data structures initialized or read in response to a common event to be written and maintained by the storage system contiguously on the non-volatile memory.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device comprising:
    a host device comprising a host processor and a group of volatile memory cells; and
    a storage system comprising a memory controller and a group of non-volatile memory cells, the storage system separate from the host processor and the group of volatile memory cells of the host device, the storage system configured to store data received from the host device;
    wherein the host processor is configured to:
        identify and tag a first group of data in the group of volatile memory cells of the host device, the first group of tagged data to be written to contiguous physical locations of the storage system and maintained at contiguous physical locations by the storage system while the first group of tagged data remains stored on the storage system; and
        write the first group of tagged data to the storage system;
        wherein the memory controller of the storage system, separate from the host processor and the group of volatile memory cells, is configured to control operations on the group of non-volatile memory cells and manage operations on the storage system, and
        wherein to identify and tag the first group of data comprises to identify and tag a first group of inactive data in the group of volatile memory cells of the host device.

2. The device of claim 1, wherein the host processor is configured to:
    assemble an offload unit of the group of volatile memory cells comprising the first group of tagged data; and
    when the amount of inactive data in the offload unit reaches a threshold, write the offload unit of inactive data to the group of non-volatile memory cells of the storage system.

3. The device of claim 2, wherein the threshold is greater than 512 KB, and wherein the host processor is configured to write the first group of tagged data to the group of non-volatile memory cells in a single write command.

4. The device of claim 3, wherein the threshold is greater than 1 MB.

5. The device of claim 1, wherein the storage system is configured to:
receive a write command for the first group of tagged data to be maintained at contiguous physical locations on the storage system;
write the first group of tagged data to contiguous physical locations on the group of non-volatile memory cells; and
maintain the first group of tagged data on contiguous physical locations on the group of non-volatile memory cells during system management operations on the group of non-volatile memory cells including the first group of tagged data while the first group of tagged data remains stored on the storage system.

6. The device of claim 5, wherein to maintain the tagged data on contiguous physical locations on the group of non-volatile memory cells during system management operations comprises not separating the first group of tagged data on the group of non-volatile memory cells during data migration or garbage collection on the non-volatile memory cells including the first group of tagged data while the first group of tagged data remains stored on the storage system.

7. The device of claim 5, wherein, to write the first group of tagged data to contiguous physical locations on the group of non-volatile memory cells, the storage system is configured to write the first group of tagged data sequentially to contiguous physical locations on a block.

8. The device of claim 5, wherein, to write the first group of tagged data to contiguous physical locations on the group of non-volatile memory cells, the storage system is configured to write the first group of tagged data across a super block.

9. The device of claim 1, wherein the host processor is configured to identify and tag data to be maintained at contiguous physical locations by the storage system for efficient recall back to the host device and to prioritize read commands from the host processor of the first group of tagged data to reduce latency.

10. The device of claim 1, wherein the host, processor is configured to identify and tag data structures initialized or read in response to a common event to be written to contiguous physical locations of the storage system and maintained at contiguous physical locations by the storage system,
wherein the data structures initialized or read in response to the common event include a program operable on the host device in a post-initialized state.

11. A method comprising:
identifying and tagging, using a host processor of a host device of a device, a first group of data in a group of volatile memory cells of the host device, the first group of tagged data to be written to contiguous physical locations of a storage system of the device and maintained at contiguous physical locations by the storage system while the first group of tagged data remains stored on the storage system, the storage system comprising a memory controller and a group of non-volatile memory cells, the storage system separate from the host processor and the group of volatile memory cells of the host device, the storage system configured to store data received from the host device;
writing the first group of tagged data to the storage system; and
controlling operations on the group of non-volatile memory cells and managing operations on the storage device using the memory controller of the storage system, separate from the host processor of the host device,
wherein identifying and tagging the first group of data comprises identifying and tagging a first group of inactive data in the group of volatile memory cells of the host device.

12. The method of claim 11, comprising:
assembling an offload unit of the group of volatile memory cells comprising the first group of tagged data; and
when the amount of inactive data in the offload unit reaches a threshold, writing the offload unit of inactive data to the group of non-volatile memory cells of the storage system.

13. The method of claim 12, wherein the threshold is greater titan 512 KB, and the method comprises:
writing the first group of tagged data to the group of non-volatile memory cells in a single write command.

14. The method of claim 13, wherein the threshold is greater than 1 MB.

15. The method of claim 11, comprising:
receiving a write command for the first group of tagged data to be maintained at contiguous physical locations on the storage system;
writing the first group of tagged data to contiguous physical locations on the group of non-volatile memory cells; and
maintaining the first group of tagged data on contiguous physical locations on the group of non-volatile memory cells during system management operations on the group of non-volatile memory cells including the first group of tagged data while the first group of tagged data remains stored on the storage system.

16. The method of claim 15, wherein maintaining the tagged data on contiguous physical locations on the group of non-volatile memory cells during system management operations comprises not separating the first group of tagged data on the group of non-volatile memory cells during data migration or garbage collection on the non-volatile memory cells including the first group of tagged data while the first group of tagged data remains stored on the storage system.

17. The method of claim 15, wherein writing the first group of tagged data to contiguous physical locations on the group of non-volatile memory cells comprises writing the first group of tagged data sequentially to contiguous physical locations on a block.

18. The method of claim 15, wherein writing the first group of tagged data to contiguous physical locations on the group of non-volatile memory cells comprises writing the first group of tagging data across a super block.

19. The method of claim 11, comprising:
identifying and tagging data to be maintained at contiguous physical locations by the storage system for efficient recall back to the host device; and
prioritizing read commands from the host processor of the first group of tagged data to reduce latency.

20. The method of claim 11, comprising:
identifying and tagging data structures initialized or read in response to a common event to be written to contiguous physical locations of the storage system and maintained at contiguous physical locations by the storage system, wherein the data structures initialized or read in response to the common event include a program operable on the host device in a post-initialized state.

21. The device of claim 1, wherein, to identify and tag the first group of data to be maintained at contiguous physical locations by the storage system, the host processor is configured to:
identify the first group of data in the group of volatile memory cells to be maintained at contiguous physical locations on the storage system; and
tag user data or metadata of the identified first group of data, wherein the tag includes an indication to the storage system to maintain the first group of tagged data at contiguous physical locations on the storage system while the first group of tagged data remains stored on the storage system.

22. The device of claim 21, wherein, to identify the first group of data, the host processor is configured to identify multiple blocks of data, and
wherein, to tag the identified multiple blocks of data, the host processor is configured to tag the user data or metadata of the identified multiple blocks of data to be maintained at contiguous physical locations by the storage system while the first group of tagged data remains stored on the storage system.

23. The device of claim 21, wherein the host processor is configured to tag the user data of the identified first group of tagged data.

24. The device of claim 21, wherein the host processor is configured to tag the metadata of the identified first group of tagged data.

25. The method of claim 11, wherein identifying and tagging the first group of data to be maintained at contiguous physical locations by the storage system comprises:
identifying the first group of data in the group of volatile memory cells to be maintained at contiguous physical locations on the storage system; and
tagging user data or metadata of the identified first group of data with an indication to the storage system to maintain the first group of tagged data at contiguous physical locations on the storage system while the first group of tagged data remains stored on the storage system.

26. The method of claim 25, wherein identifying the first group of data comprises identifying multiple blocks of data, and
wherein user data or metadata of the identified data comprises tagging user data or metadata of the identified multiple blocks of data to be maintained at contiguous physical locations by the storage system while the first group of tagged data remains stored on the storage system.

27. The method of claim 25, wherein tagging the user data or the metadata of the identified data comprises tagging the user data of the identified first group of tagged data.

28. The device of claim 1, wherein the device includes an electronic device, wherein the electronic device includes a bidirectional serial or parallel communication interface, and wherein the host device of the electronic device is configured to communicate to the storage system of the electronic device over the bidirectional serial or parallel communication interface.

* * * * *